(12) United States Patent
Van Hest et al.

(10) Patent No.: US 12,405,331 B2
(45) Date of Patent: Sep. 2, 2025

(54) SHIELDED GRADIENT ASSEMBLY

(71) Applicant: KONINKLIJKE PHILIPS N.V., Eindhoven (NL)

(72) Inventors: Augustinus Bertus Petrus Van Hest, Best (NL); Jan Konijn, Den Bosch (NL); Johannes Adrianus Overweg, Uelzen (DE); Martijn Krelis Termeer, Poppel (BE)

(73) Assignee: Koninklijke Philips N.V., Eindhoven (NL)

( * ) Notice: Subject to any disclaimer, the term of this patent is extended or adjusted under 35 U.S.C. 154(b) by 86 days.

(21) Appl. No.: 18/279,230

(22) PCT Filed: Mar. 1, 2022

(86) PCT No.: PCT/EP2022/055124
§ 371 (c)(1),
(2) Date: Aug. 29, 2023

(87) PCT Pub. No.: WO2022/184698
PCT Pub. Date: Sep. 9, 2022

(65) Prior Publication Data
US 2024/0151792 A1    May 9, 2024

(30) Foreign Application Priority Data

Mar. 2, 2021 (EP) .................................... 21160206
Aug. 10, 2021 (EP) .................................... 21190560

(51) Int. Cl.
*G01R 33/421* (2006.01)
*G01R 33/385* (2006.01)
(52) U.S. Cl.
CPC ..... *G01R 33/4215* (2013.01); *G01R 33/3856* (2013.01)

(58) Field of Classification Search
CPC ............ G01R 33/4215; G01R 33/3856; G01R 33/3858
See application file for complete search history.

(56) References Cited

U.S. PATENT DOCUMENTS

2007/0063705 A1\* 3/2007 Ham .................... G01R 33/385
                                                          324/318
2008/0259560 A1    10/2008 Lvovsky
(Continued)

FOREIGN PATENT DOCUMENTS

EP       1843165 A1    10/2007
WO    2012014914 A1     2/2012

OTHER PUBLICATIONS

International Search Report and Written Opinion from PCT/EP2022/055124 mailed May 20, 2022.

*Primary Examiner* — Daniel R Miller (57) ABSTRACT

A shielded gradient coil assembly (40) to generate a gradient magnetic field, the assembly comprises on a plurality of radially inner and outer coaxial cylindrical surfaces a gradient field coil arrangement on the radially inner cylindrical surfaces including a longitudinal gradient field coil system (131) having one or more axial circumferential electrically conducting hollow z-field windings having a smaller transverse cross-section and a transverse gradient field coil system (132) having hollow (x,y)—field electrical conductors having a smaller transverse cross-section and arranged as saddle coils on the surfaces of the inner cylindrical surfaces. A gradient shield coil arrangement is provided on the radially outer cylindrical surfaces including a longitudinal gradient shield coil system (141) having one or more axial circumferential electrically conducting hollow z-shield windings having a larger transverse cross-section and a transverse gradient shield coil system (142) having solid electrical conductors arranged as saddle coils on the surfaces (Continued)

of the outer cylindrical surfaces. In this way an optimum combination is achieved of efficient direct and indirect cooling of the conductors while keeping eddy current effects at a low level.

12 Claims, 4 Drawing Sheets (56) References Cited

U.S. PATENT DOCUMENTS

| | | | |
|---|---|---|---|
| 2014/0302258 A1* | 10/2014 | Mathieu | G01R 33/3858 |
| | | | 118/712 |
| 2015/0177347 A1 | 6/2015 | Tsujita et al. | |
| 2015/0269884 A1 | 9/2015 | Sato et al. | |
| 2015/0338482 A1 | 11/2015 | Sakakura et al. | |
| 2015/0346297 A1 | 12/2015 | Naka et al. | |
| 2017/0038444 A1* | 2/2017 | Seeber | G01R 33/3858 |
| 2017/0059675 A1 | 3/2017 | Moon et al. | |
| 2018/0335493 A1 | 11/2018 | Kimmlingen | |
| 2021/0123996 A1 | 4/2021 | Yue et al. | |

\* cited by examiner

SHIELDED GRADIENT ASSEMBLY

CROSS REFERENCE TO RELATED APPLICATIONS

This application is a U.S. national phase application of International Application No. PCT/EP2022/055124 filed on Mar. 1, 2022, which claims the benefit of EP application Ser. No. 21/160,206.5 filed on Mar. 2, 2021 and EP application Ser. No. 21/190,560.9 filed Aug. 10, 2021, each of which is incorporated herein by reference.

FIELD OF THE INVENTION

The invention pertains to a shielded gradient assembly which is configured to generate gradient magnetic fields in various directions in an examination zone. The shielded gradient system comprises a gradient field coil arrangement which generates the gradient magnetic fields and a gradient shield coil arrangement that compensates the gradient magnetic fields outward form the shielded gradient assembly.

Background of the Invention

Such a shielded gradient assembly is known from the international application WO2005/0431185.

The known shielded gradient system has a shield coil with a z-coil with hollow conductors for direct cooling purposes and water flows through the hollow conductors. The z-coil is sandwiched between x-coils and y-coils of the shield coil. These x-coils and y-coils are indirectly cooled by the z-coil. Further, The US patent application US2008/259560 discloses a gradient coil assembly that includes interturn channels for transporting a cooling fluid and placed between turns of the conductors of the coil.

SUMMARY OF THE INVENTION

An object of the invention is to provide a shielded gradient assembly that has an optimised performance as compared to the known shielded gradient assembly.

This object is achieved by the shielded gradient assembly of claim 1.

The shielded gradient coil assembly of the invention has the gradient field coil arrangement's electrical conductors and the gradient shield coil arrangement's electrical conductors arranged on respective inner and outer coaxial surfaces. The coaxial cylindrical surface may be physical surfaces, e.g. formed by coil former, or they may be virtual surfaces formed by the shape of self-carrying circumferential or saddle coil conductors. According to the invention, the gradient field coil arrangement has sets of electrical conductors to generate gradient magnetic fields in the longitudinal (z), and two transverse (x,y) directions. The gradient field coil arrangement is provided with hollow electrical conductors of a smaller cross section orthogonal electrical conductor's elongation. For example these hollow electrical conductors have e a cross section of 9-50 mm$^2$ and a lumen cross section of 6-40 mm$^2$, good results are achieved for a lumen of 6×6 mm$^2$ rectangular cross sections The smaller hollow electrical conductors may have a rectangular cross section as small as 2.5-3.0 to 3.0×4.0 mm Fluid coolant may be passed through the hollow electrical conductors for direct cooling when electrical current passes though the electrical conductors. The smaller cross section suppresses the generation of eddy currents in the gradient coil. Additionally the generation of eddy currents in in components outside the gradient coils due to switching of the electrical currents, notably when the shielded gradient assembly is operated in a magnet system, for example a superconducting magnet system. The longitudinal gradient shield coil system's axial circumferential electrically conducting hollow z-shield windings have a larger transverse cross-section of about 100, 120 or 200-500 mm$^2$ In practice the gradient shield coil system's axial circumferential electrically conducting hollow z-shield windings have a transverse cross-section that is more than twice than that of the gradient field coil system's axial circumferential electrically conducting hollow z-shield windings.

An insight of the invention is to employ hollow electrical conductors with direct fluid cooling with smaller cross sections in the gradient field coil arrangement, because there the magnetic flux density is higher. In particular all electrical conductors of the gradient field coil arrangement are formed as hollow conductors. For the shield coil arrangement, the transverse saddle coils may be formed as surface area coils or may formed by solid conductors, saddle coils disposed on or made out of plates. The term surface area conductor represents a gradient or shield coil structure that has its electrical conductors ('windings') in a (single) surface's area. The surface may be curved so that the electrical conductors on the curved surface lie in a saddle shaped area (hence the term 'saddle coil'. The surface are conductors are employed in the transverse gradient directions, in distinction to the solenoid geometric arrangements of the electrical conductors of the longitudinal gradient directions. The circumferential coils of the shield coil arrangement have a higher capacity direct fluid cooling with sufficient cooling capacity to also provide indirect cooling the surface area coils. The larger cross section of the hollow circumferential coils of the shield coil arrangement cause a larger susceptibility for eddy current generations, but in the in the gradient shield coil arrangement the magnetic flux is lower so that eddy current generation is reduced. In this way an optimum combination is achieved of efficient direct and indirect cooling of the conductors while keeping eddy current effects at a low level. An insight of the invention is to employ differently dimensional electrical conductors, notably as far as their cross section in concerned. On the one hand, the eddy current behaviour of the shielded gradient coil of the invention is improved by employing electrical conductors with smaller cross sections in the gradient field coil arrangement where the magnetic flux is higher. On the other hand, indirect cooling capacity of the surface area coils by the circumferential shield coil is improved by employing hollow conductors with a larger cross section which provides higher cooling capacity. the shielded gradient coil of the invention employs the combination of electrical conductors of narrower cross section that inherently have lesser susceptibility eddy currents with electrical conductors, notably hollow fluid cooled, with a higher cooling capacity to allow for indirect cooling of neighbouring electrical conductors. The shielded gradient coil of the invention distinguishes from known conventional shielded gradient coils on the basis of these differently cross sectioned electrical conductors in respective parts of the shielded gradient coil. At least to some extent eddy current susceptibility decreases with decreasing cross section and that cooling capacity increases with the cross section of the lumen of the hollow electrical conductors. In parts of the shielded gradient coil with lower magnetic flux, wider cross sections are acceptable in favour of higher cooling capacity and in parts of the shielded gradient coil with higher magnetic flux low eddy current susceptibility is relevant.

According to an alternative arrangement, the object of the invention is achieved by the shielded gradient coil assembly defined in claim 2. In this alternative arrangement solid conductors are employed in the gradient field coil arrangement for the longitudinal field coil arrangement as well as for the gradient shield coil arrangement. In this arrangement cooling of the gradient field coil arrangement is done by electrically non-conductive cooling channels, e.g. plastic tubes, that are arranged between the solid z-field windings and the solid (x,y)—field saddle coil windings.

The alternative configuration of the shield gradient coil assemblies of the invention have in common that different cooling principles for the gradient field coil arrangement and the gradient shield coil arrangement are used, respectively. In particular in the gradient field coil the longitudinal and transverse gradient field coil arrangements are individually cooled, e.g. either by direct fluid cooling through hollow conductors or by the intersperse electrically non-conducting cooling channels, while in the gradient shield coil arrangement the transverse gradient shield coil system is cooled indirectly through the longitudinal shield coil system that is fitted with the larger size hollow conductors.

These and other aspects of the invention will be further elaborated with reference to the embodiments defined in the dependent Claims.

In an embodiment the shielded gradient coil assembly of the invention, the longitudinal gradient shield coil system's electrical conductors are in thermal correspondence with the transverse gradient shield coil system's surface area electrical conductors. This achieves the surface area electrical conductors, that may be formed as saddle coils are indirectly cooled by the cooling capacity of the longitudinal gradient shield coil system's electrical conductors. These latter electrical conductors are hollow conductors though which a fluid coolant, e.g. (demi)water, that actively carries-off heat from the gradient shield coil arrangement.

In an embodiment of the shielded gradient coil assembly, the sets of electrical conductors for generating the (x,y) gradient magnetic fields and the (x,y) shielding gradient magnetic fields are configured such that the sets of field and shield conductors for equal orientations are positioned at about equal radial distances. Thus, for both transverse directions (x,y) about equal radial separation is achieved for the respective sets of electrical conductors, or coil arrangements, for generation of gradient magnetic field and shielding magnetic fields for gradient magnetic fields with the same transverse orientation. That is, the mutual radial distances between the shield coil arrangement and the field coil arrangement are about equal for the x-gradients and the y-gradients. This achieves more comparable or even almost equal performance within the shielded gradient coil assembly of efficiency of the electrical conductors generating field and shield magnetic fields.

In another embodiment of the shielded gradient coil assembly, the transverse gradient shield coil systems has two radially offset sets of surface area electrical conductors for generating shielding gradient magnetic field in respective transverse orientations positioned radially outward relative to the longitudinal gradient shield coil system. That is the sets of electrical conductor for generating the gradient magnetic fields in the transverse x-direction and y-direction, respectively are arranged in parallel adjacent cylindrical surfaces, e.g. as saddle coils. The transverse gradient field coil system has two radially offset saddle coils built-up from hollow electrical conductors. These hollow electrical conductors are smaller sized, so that eddy currents due to gradient switching are suppressed. The eddy current suppression avoids or reduces technical drawbacks such as eddy currents degrade the speed and efficiency of gradient switching; generation error fields and image artefacts. Suppression of eddy currents also reduces heat dissipation into the magnet system's cryostat, so that for non-sealed superconducting magnets boil-off of superconducting coolant (liquid He) for the magnet system's superconducting field coils is reduced.

In another example of the shielded gradient coil assembly, the transverse gradient field coil system's hollow electrical conductors are arranged closer to the examination zone where the patient to be examined may be positioned, than the longitudinal gradient field coil system's circumferential electrical conductors. This spatial configuration optimises the efficiency of the gradient field coil arrangement in that the transverse field coil system is closer to the examination zone (saddle coils being less efficient in nature), while the more efficient longitudinal field coil arrangement is at a larger distance from the examination zone. The efficiency of the gradient field coil arrangement is represented by the ratio of gradient amplitude to applied electrical current strength.

These and other aspects of the invention will be elucidated with reference to the embodiments described hereinafter and with reference to the accompanying drawing wherein

DETAILED DESCRIPTION OF THE EMBODIMENTS

Background of the Invention

Gradient coils usually are limited in their performance because otherwise the coil can overheat. This heat is generated by Ohmic losses as well as eddy current losses. It is common practice to cool the coil via liquid cooling as such. This is done by several methods.

Add dedicated cooling layers in the gradient coil build up, these layers have cooling channels which extract heat from the coil windings via conduction Use the coils which run in circumferential direction as a cooling channel by making them hollow and cool in that manner. In cylindrical coils these are the coils responsible of making a gradient field in the axial direction. The saddle coils cool indirectly via conduction to the cooled circumferential coils Having all conductors directly cooled, using hollow circumferential coils and hollow saddle coils According to the invention, we created a highly efficient gradient coil, with a unique build-up. Existing gradient coils only have hollow conductors in circumferential direction or have all hollow conductors or have indirect cooling by separate cooling layers. These conventional designs all have significant disadvantages, which are overcome in the design of the invention. This decreases TR's or waiting times between heavy scans, allowing a higher duty cycle and increasing patient throughput. It also enables use of higher gradient strength, leading to shorter TE's improving SNR.

We can divide conventional gradient coil cooling concepts into three concepts:

One axis directly cooled, the other axes indirectly cooled as known from the international application WO2005/0431185.

Pros

Easy to manufacture. The circumferential conductors have a low curvature and are easy to wind.

Cons

Direct cooling is only in place were the circumferential coils are

The enclosing material needs to have a high thermal conductivity in order to transport heat from the saddle coils to the circumferential coils The layers in-between the cooled circumferential coils and the saddle coils needs the be thin, which conflicts with electrical isolation performance One Axis needs to create the cooling capacity for all three so the size of this conductor is much greater than if it only needed to dissipate its own heat. Due to large conductors eddy current losses increase significantly.

Figure 1:
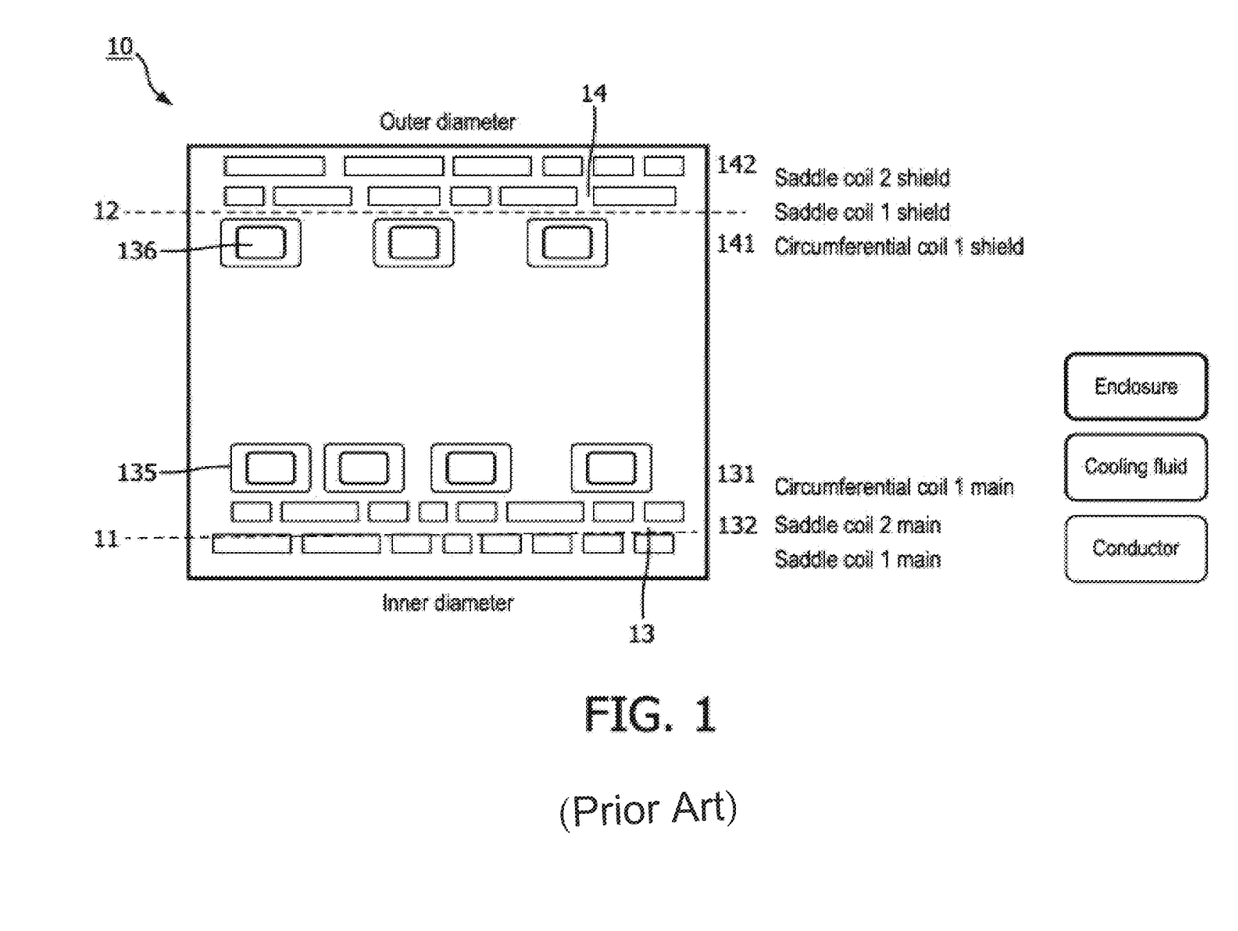
FIG. 1 shows part of a cross section in side elevation of a prior art gradient coil.
Figure 2:
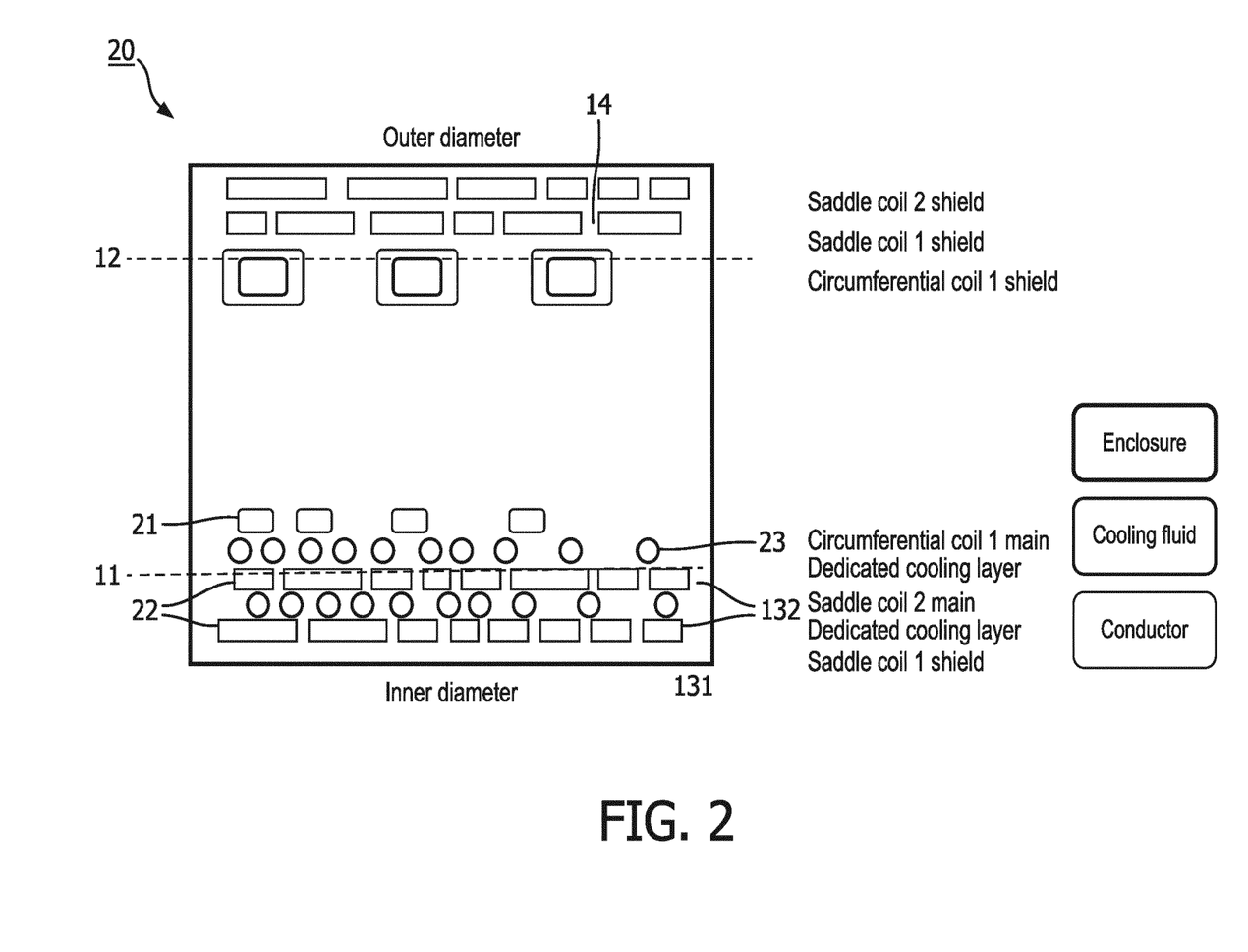
FIG. 2 shows part of a cross section of a side elevation gradient coil of the invention with dedicated cooling channels on the inner main coils.

FIG. 2 shows part of a cross section in side elevation of a prior art gradient coil 10. In fact, FIG. 1 shows only half of the longitudinal cross section of the cylindrical arrangement. Inner and outer cylindrical surfaces are indicated as 11 and 12. The surface area (saddle) field coil arrangement 132 proves for transverse gradient coil and solenoid type longitudinal field (z-coil) cols 131 generate gradient magnetic fields in the transverse and longitudinal directions. The surface area (saddle) shield coil arrangement 132 proves for transverse gradient coil and solenoid type longitudinal n (z-coil) cols 131 generate shielding gradient magnetic fields in the transverse and longitudinal directions. The longitudinal field and shield coils are formed from hollow conductors. Through the lumen 136 of these hollow conductors cooling fluid is passed to directly cool the longitudinal shield coils, that in turn indirectly cool the transverse field and shield gradient coils 13, 14.

Detailed Aspects of the Invention

Separate cooling channels outside the conductors. In this example only the inner coils have separate cooling channels, but it can also be used on the outer coils, or on both.

Pros

Easy to manufacture

Cooling density can be adjusted to the points where needed

Conductors have a small cross section so eddy current losses are minimal

Cons

Separate cooling layer decrease the distance between the main coils and the shield coils. Also the more inward inner coils are further away from the patient. This together leads to poor electromagnetic performance.

If using a conducting layer, the risk of partial discharges also increases.

Additional layers will bring additional cost to the product.

Dummy turns are needed to cool the saddle coils at places where there are no circumferential coils needed on the outer.

FIG. 2 shows p[art of a cross section of a side elevation gradient coil 20 of the invention with dedicated cooling channels 23 on the inner main coils. In particular the dedicated cooling channels are provided between the cylindrical layers of the saddle coils of the transverse gradient field coil system.

Using all hollow conductors for inner and outer coils

Figure 3:
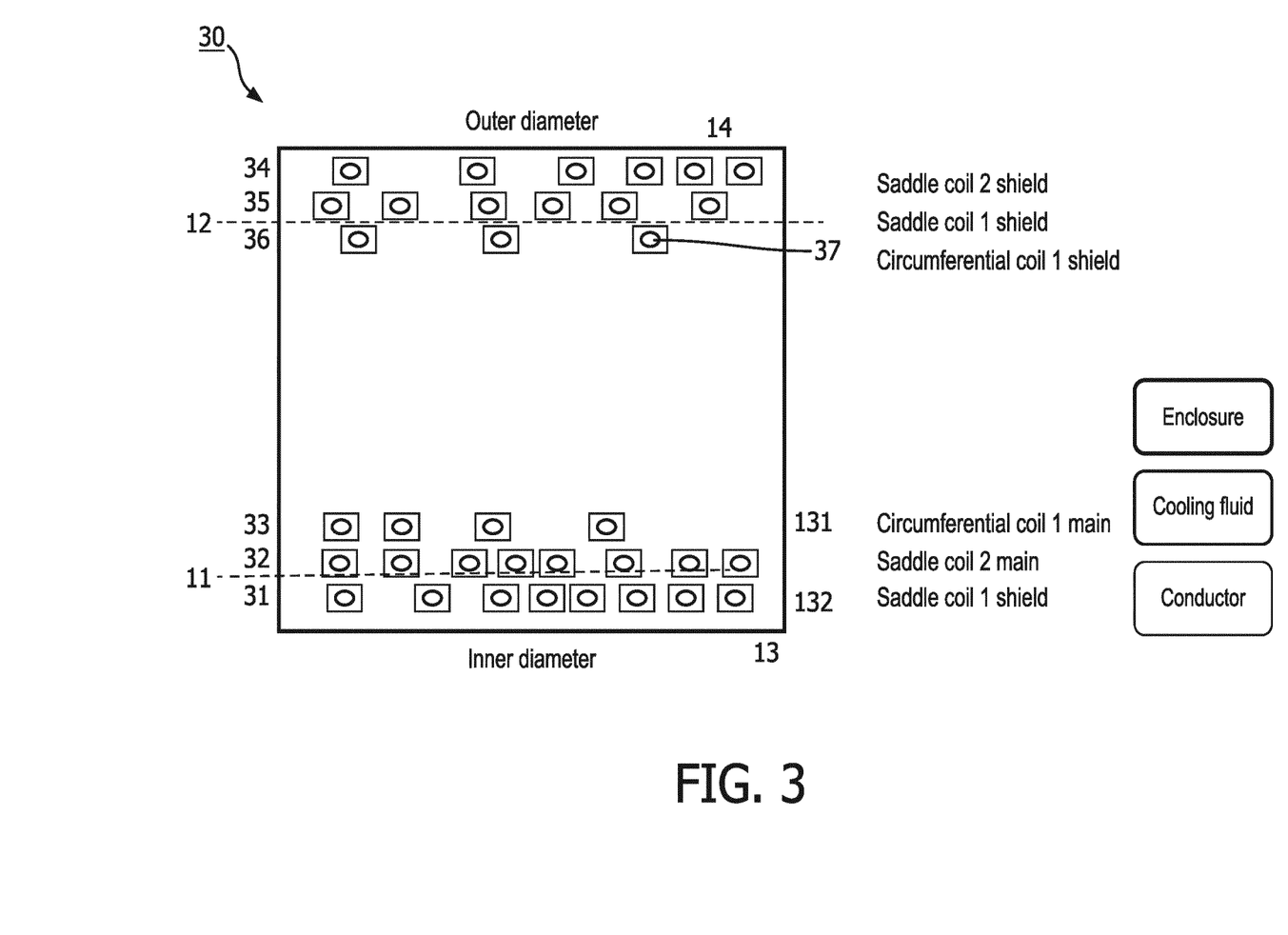
FIG. 3 shows part of a cross section of a side elevation of the gradient coil with an all hollow conductor design and FIG. 4 shows part of a cross section of a side elevation of the gradient coil of the gradient coil of the invention with a hybrid cooling layout.

FIG. 3 shows part of a cross section of a side elevation of the gradient coil 30 with an all hollow conductor design. The longitudinal 132 and transverse field coil arrangements 132 include hollow conductors 31,32 and 33. The longitudinal 141 and transverse shield coil arrangements 132 include hollow conductors 34, 35 and 36. These hollow conductors each have a lumen 37 through which a cooling fluid is passed to individually cool the respective hollow conductors.

Pros

Cooling is exactly where it needs to be, close to a conductor

No thermal conductivity requirements to the enclosure

Small conductors so eddy current losses are minimal

Cons

Not cost effective because the hollow conductors are more expensive

The distance between the main coils and the shield coils is decreased (because shield coil stack is thicker), this leads to a lower efficiency.

The more outward inner coils are further away from the patient. This also leads to a lower efficiency.

The electromagnetic performance is compromised and the shield coils are cooled more than needed.

Hybrid cooling

The concept of this invention, hybrid cooling: all inner main coils are hollow and directly cooled, on the outer shield coils only the circumferential coil is hollow and cools the saddle coils directly via conduction.

Figure 4:
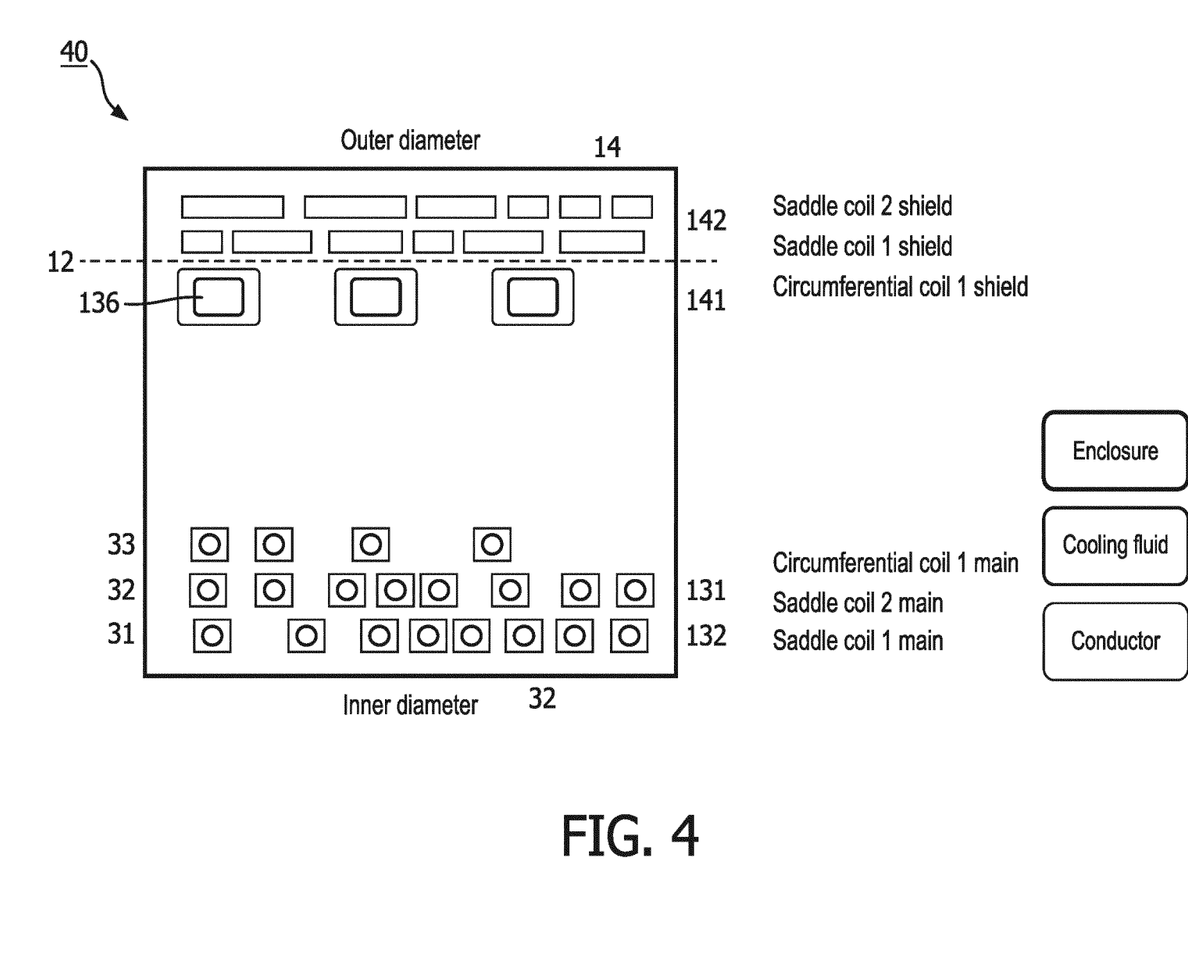

FIG. 4 shows part of a cross section of a side elevation of the gradient coil 40 of the gradient coil of the invention with a hybrid cooling layout. In this arrangement the longitudinal and transverse shield coils are configured as in the prior art configuration of FIG. 1 in which the transverse shield coils are surface area (saddle) coils 142 that are indirectly cooled by the longitudinal shield coils 141 that have hollow conductors where cooling fluid is passed through their lumen 136.

This approach solves many issues with and optimises performance by looking at field densities and heat generation densities.

We will discuss the cons of the conventional designs compared to the proposed solution in more detail here below:

Concept 1 only hollow circumferential conductors Cooling is only in place were the circumferential coils are In a gradient coil the current density isn't uniform so the circumferential conductors are sparsely wound in some locations. Cooling requirements have to be mitigated by dummy turns. Coils which do carry water but no electrical current so they don't contribute to the field.

The enclosing material needs to have a high thermal conductivity in order to transport heat from the saddle coils to the circumferential coils No special fillers necessary, the high thermal conductivity is needed on the inner coil because there the heat generation is a factor higher. On the shield coils it is far less critical.

One axis needs to create the cooling capacity for all three so the size of this conductor is much greater than if it only needed to dissipate its own heat. Due to large conductors eddy current losses increase significantly.

On the inner only small conductors are used, on the outer we still have large conductors. However, the shield coils are in place in order to counter the main magnetic gradient field. Causing magnetic flux densities to be lower near the shield coil than the main coils.

Concept 2 separate cooling channels outside the conductor

Separate cooling layer decrease the distance between the main coils and the shield coils.
This leads to lower electromagnetic performance.
No separate cooling layers exist in the hybrid cooling.
If using a conducting layer, the risk of partial discharges also increases.
Not applicable because no separate cooling layer is used.
Additional layers will bring additional cost to the product.
Not applicable because no separate cooling layer is used.
Concept 3 all hollow conductors
Not cost effective because the hollow conductors are more expensive
In the hybrid cooling layout, the expensive hollow saddle conductors are only used where they are required. This because the internal heat generation of the main coils is far greater than the outer coils.
Decrease the distance between the main coils and the shield coils because shield coil stack it thicker. This leads to a lesser electromagnetic performance.
They hybrid cooling mitigates this by using plate conductors on the outer coil making this a flat as possible.
shield coils are cooled more that it needs to be
No overcapacity on the outer coil with respect to cooling.

With more insight into the drawbacks of large conductors in the main coils, a new hybrid cooling was designed. The previous method was to put in large conductors in order to reduce the Ohmic resistance. This leads to a low resistivity at low frequency but high eddy current heating at higher frequencies. The hybrid design allows conductors in the main coil with small cross sections which is beneficial because there the magnetic flux density is high. In the shield coils the magnetic flux density is lower so larger plate conductors can be used without the risk of generating excessive eddy currents and heat.

This combines the high cooling capacity in the main coils where you need it and space saving plate conductors at locations where cooling isn't an issue. A high performance cooling build-up for gradient coils is designed. This is done in a way to ensure that most cooling is applied at locations that require it and at the same time improve the electromagnetic design.

In the example rectangular conductors ar used. This is by no means necessary both the shape of the conductor as well as the shape of the cooling channel can be modified. During the design build constraints do need to be taken into account like a minimal curve radius in order not to kink the conductor.

The technical advantage is acahieved due to the cooling performance supplied by having the cooling internally in combination with the small conductors in order to minimize eddy current effects. So making one of the main layer indirectly cooled would bring back a lot of the disadvantages. One way of designing a similar efficient design would be to place the cooling agent outside of the conductor but still letting it make contact. This is known from the international application WO2018/206370.

Any scan which is limited by the duty cycle of the gradient coil will benefit from this type of cooling. This is for example the case for fMRI scans with high frequency, high duty cycle EPI's. Other applications are for diffusion weighted MRI scans, which use high diffusion gradients. The efficiency gain from this hybrid design is beneficial for those scans (with same gradient amplifier power you can create higher gradient fields). Also the high currents generate a lot of heat and the hybrid design is able to cool this away efficiently.

The invention claimed is:

1. A shielded gradient coil assembly configured to generate a gradient magnetic field, the assembly comprising:
    a plurality of radially inner and outer coaxial cylindrical surfaces;
    a gradient field coil arrangement on the radially inner cylindrical surfaces including:
        a longitudinal gradient field coil system having one or more axial circumferential electrically conducting hollow z-field windings having a first transverse cross-section,
        a transverse gradient field coil system having hollow (x,y)-field electrical conductors having a second transverse cross-section and arranged as saddle coils on the surfaces of the inner cylindrical surfaces,
    a gradient shield coil arrangement on the radially outer cylindrical surfaces including:
        a longitudinal gradient shield coil system having one or more axial circumferential electrically conducting hollow z-shield electrical conductors having a third transverse cross-section,
        a transverse gradient shield coil system having solid electrical conductors arranged as saddle coils on the surfaces of the outer cylindrical surfaces,
    wherein the third transverse cross-section is larger than the first transverse cross-section and the second transverse cross-section.

2. The shielded gradient coil assembly of claim 1, wherein the longitudinal gradient shield coil system's hollow electrical conductors are in thermal correspondence with the transverse gradient shield coil system's saddle coils.

3. The shielded gradient coil assembly as claimed in claim 2, wherein
    the saddle coils are configured to generate a shielding gradient magnetic field in a first transverse orientation radially outward from the saddle coils and to generate the shielding gradient magnetic field in a second transverse orientation; and
    the longitudinal gradient field coil system has two radially offset sets of hollow electrical conductors, wherein a first set of hollow electrical conductors are configured to generat the gradient magnetic field in the second transverse orientation that is positioned radially outward from a second set of hollow electrical conductors to generate a gradient magnetic field in the first transverse orientation.

4. A-The shielded gradient coil assembly of claim 1, wherein the transverse gradient shield coil system has two radially offset sets of saddle coils configured to generate a shielding gradient magnetic field in respective transverse orientations positioned radially outward relative to the longitudinal gradient shield coil system.

5. The shielded gradient coil assembly of claim 1, wherein the z-field electrical conductors of the gradient field coil system are located radially inward relative to the saddle coils of the transverse gradient field coil system.

6. A magnet system comprising a set of field coils to generate a uniform static magnetic field in an examination zone of a magnet and a gradient coil assembly of claim 1.

7. The shielded gradient coil assembly of claim 1, wherein the third transverse cross-section has an area within a range of about 100-500 mm$^2$.

8. The shielded gradient coil assembly of claim 7, wherin the area of the at least one of the first transverse cross-section or the second transverse cross-section is within a range of about 9-50 mm².

9. The shielded gradient coil assembly of claim 7, wherin the area of the the first transverse cross-section and the second transverse cross-section are equal to each other.

10. The shielded gradient coil assembly of claim 1, wherin at least one of the first transverse cross-section or the second transverse cross-section has an area within a range of about 9-50 mm².

11. The shielded gradient coil assembly of claim 1, wherin the first transverse cross-section and the second transverse cross-section have an area equal to each other.

12. A shielded gradient coil assembly to generate a gradient magnetic field, the assembly comprising:
  a plurality of radially inner and outer coaxial cylindrical surfaces;
  a gradient field coil arrangement on the radially inner cylindrical surfaces including:
    a longitudinal gradient field coil system having one or more axial circumferential electrically conducting solid z-field electrical conductors having a first transverse cross-section,
    a transverse gradient field coil system having solid (x,y)-field electrical conductors having a second transverse cross-section and arranged as saddle coils on the surfaces of the inner cylindrical surface;
  electrically insulating cooling channels arranged between the solid z-field electrical conductors and the solid (x,y)-field electrical conductors;
  a gradient shield coil arrangement on the radially outer cylindrical surfaces including:
    a longitudinal gradient shield coil system having one or more axial circumferential electrically conducting hollow z-shield electrical conductors having a third transverse cross-section;
    a transverse gradient shield coil system having solid electrical conductors arranged as saddle coils on the surfaces of the outer cylindrical surfaces, wherein the third transverse cross-section is larger than the first transverse cross-section and the second transverse cross-section.

* * * * *